United States Patent [19]

Denlinger

[11] 4,250,520
[45] Feb. 10, 1981

[54] FLIP CHIP MOUNTED DIODE

[75] Inventor: Edgar J. Denlinger, East Windsor, N.J.

[73] Assignee: RCA Corporation, New York, N.Y.

[21] Appl. No.: 20,333

[22] Filed: Mar. 14, 1979

[51] Int. Cl.³ .................... H01L 23/48; H01L 29/44; H01L 29/52

[52] U.S. Cl. ........................... 357/68; 357/69; 357/71; 357/80; 333/247

[58] Field of Search ............ 357/80, 81, 71, 69, 357/68; 333/103, 246, 247

[56] References Cited

U.S. PATENT DOCUMENTS

| | | | |
|---|---|---|---|
| 3,254,274 | 5/1966 | Garcia et al. | 357/80 |
| 3,404,214 | 10/1968 | Elliott | 357/80 |
| 3,711,778 | 1/1973 | Day | 333/247 |
| 3,768,050 | 10/1973 | Stiles | 333/246 |
| 3,774,123 | 11/1973 | Hume | 333/103 |
| 3,967,296 | 6/1976 | Intrator | 357/80 |
| 4,009,456 | 2/1977 | Hopfer | 333/247 |
| 4,048,438 | 9/1977 | Zimmerman | 357/80 |
| 4,127,830 | 11/1978 | Chalifour et al. | 357/80 |

*Primary Examiner*—Andrew J. James
*Attorney, Agent, or Firm*—Birgit E. Morris; Donald S. Cohen; Kenneth R. Glick

[57] ABSTRACT

A planar semiconductor device having a cathode region surrounding an anode region is flip chip mounted to a conductor film circuit. An anode contact extends from the anode region and is bonded to a first portion of the conductor film circuit such that that portion of the cathode region which overlaps the first portion of the conductor film circuit is minimized. That portion of the cathode region distal from the anode region is relatively wide, and a relatively large area cathode contact extends from the cathode region and is bonded to a second portion of the conductor film circuit.

9 Claims, 4 Drawing Figures

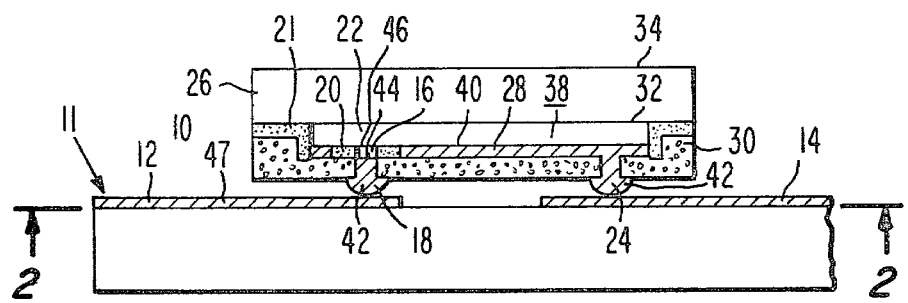
Fig. 1.
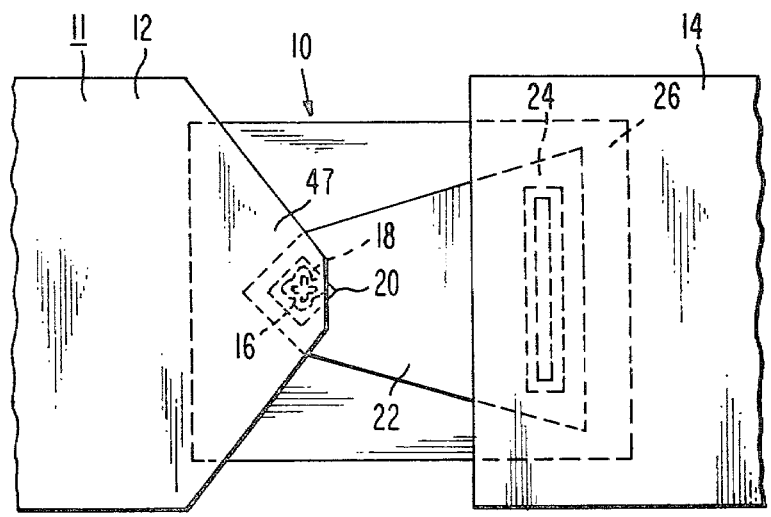
Fig. 2.
Fig. 3.
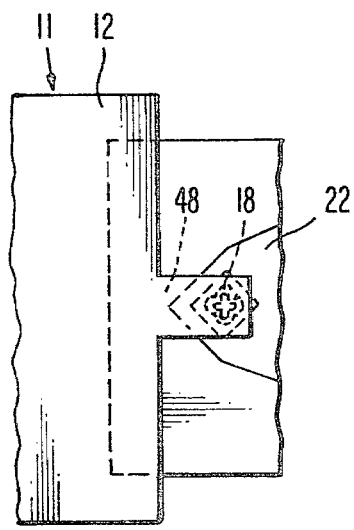
Fig. 4
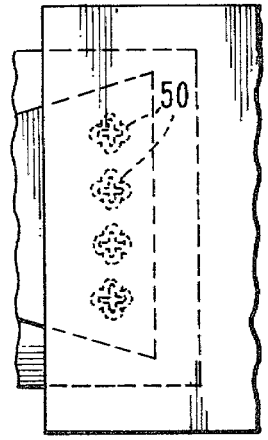

FLIP CHIP MOUNTED DIODE

BACKGROUND OF THE INVENTION

The present invention relates to thin film integrated circuits and more specifically to flip chip mounted mixer and varactor diode circuits for microwave applications. The circuit generally comprises a planar semiconductor diode attached across a discontinuous conductor film line on a circuit carrier.

Microwave diode mixers are used to convert a signal at one frequency to one at a somewhat lower frequency. Varactors can be used as multipliers (to increase signal frequency), as well as tuning elements, switching circuits, and phase shifters. With either type of diode, to obtain high performance in terms of low conversion loss and noise, it is required to maximize the frequency cut off parameter of the diode, and to minimize the series (parasitic) inductance of the diode/conductor film combination. Since the frequency cut off parameter is inversely proportional to the product of the diode's spreading resistance and parasitic capacitance, it is desirable to minimize the spreading resistance and parasitic capacitance, as well as the parasitic inductance, when designing a mixer or varactor diode circuit.

The parasitic capacitance and inductance exhibited by a diode is in part a function of its mounting configuration on the conductor film circuit, and it has been observed that flip chip mounting yields lower parasitics than other mounting techniques (such as wire bonding). To facilitate flip chip mounting, the diode can include contacts comprising posts having bonding bumps which can be directly bonded to a film circuit. A design for such contacts, for example, is described in U.S. Pat. No. 3,874,918, issued Apr. 1, 1975, to M. I. Nechtow and J. Sandera, as well as in co-pending U.S. patent application Ser. No. 869,642, filed Jan. 16, 1978, by E. J. Denlinger and H. S. Veloric.

The spreading resistance exhibited by either type of microwave diode is a function of its geometry. Specifically, the spreading resistance depends in part upon the anode geometry and anode/cathode configuration.

To further reduce the parasitic capacitance and inductance of the diode, as well as to minimize its spreading resistance, the present invention has been developed.

SUMMARY OF THE INVENTION

A semiconductor device having a cathode region surrounding an anode region is flip chip mounted to a conductor film circuit. This configuration of a cathode surrounding an anode reduces the spreading resistance of the device.

The anode region contacts a first portion of the conductor film and the cathode region contacts a second portion. The geometries of the device and the conductor film are such that the portion of the cathode region which overlaps the first portion of the conductor film is minimized, thereby reducing the parasitic capacitance of the circuit. Furthermore, the design utilizes a wide cathode region, which minimizes the parasitic inductance of the device and reduces its contact resistance to the conductor film circuit.

BRIEF DESCRIPTION OF THE DRAWINGS

FIG. 1 is a cross-sectional view of a preferred embodiment of a flip chip mounted diode circuit which incorporates the present invention.

FIG. 2 is a second view of the preferred embodiment.

FIG. 3 is an alternate embodiment of the conductor film pattern.

FIG. 4 is an alternate embodiment of the cathode contact of the semiconductor device.

DETAILED DESCRIPTION

Referring to FIG. 1, the preferred embodiment of a thin film circuit of the present invention comprises a semiconductor device 10 attached to a conductor film circuit 11. Although the device can be any planar semiconductor device having anode and cathode contacts, the present invention is directed towards mixer or varactor diodes for use in microwave circuit applications.

The device 10 comprises a substrate 26 having first and second planar surfaces (32 and 34, respectively). The substrate material might be, for example, semi-insulating gallium arsenide, although other insulating or semiconductor materials might be equivalently effective. Although illustrated as a rectangular solid, a rectangular shape is not necessary to the invention.

On the first substrate surface 32 there is delineated a planar diode 38 containing either a PN or Schottky barrier junction (and yielding either a varactor or mixer diode, respectively). In either case, the diode structure includes a generally triangular cathode region 22 (of N+type semiconductor material, for example) having a surface 40 substantially parallel to the second surface 34 of the substrate.

In the case of a varactor, an anode region 16 (of P type material, for example) creates a PN junction 46 with the cathode region 22, and extends from the cathode surface 40 from an area in proximity to an apex of the triangular cathode region 22. A passivation layer 20 is adjacent to the junction 46, and a passivation layer 21 is adjacent to the edge of the cathode region 22. Both of these passivation layers can be formed, for example, by RF sputtering or plasma deposition of $SiO_2$ and/or $Si_3N_4$. Cathode metallization 28 covers the cathode surface 40 and surrounds the passivation layer 20 surrounding the junction 46.

Projecting from the anode region 16 and cathode metallization 28, are anode and cathode contacts (18 and 24, respectively), each of which terminates in a bonding bump 42. Although the contacts are illustrated as having a cross-shaped cross-section, this shape is not necessary to the invention. This cross-sectional configuration is desirable for electrical and mechanical considerations, however, and may be manufactured, for example, in accordance with U.S. patent application Ser. No. 869,642, now U.S. Pat. No. 4,173,768, or U.S. Pat. No. 3,874,918. A dielectric spacing layer 30 (of a polyimide material, for example), coats the diode structure 38, surrounds the contacts 18 and 24, and creates a substantially uniform layer which underlies and supports the bonding bumps 42.

When the device 10 is a mixer diode (as opposed to a varactor), a Schottky barrier rather than a PN junction is created in the diode 38. In this case, the anode region 16 is of similar conductivity type material as the cathode region 22 (although it may be of different conductivity value), and a Schottky barrier junction 44 is created at the interface between the anode region 16 and the anode contact 18. The diode structure is otherwise similar to that previously described for a varactor.

For either a mixer or varactor circuit the conductor film circuit 11 comprises a circuit carrier 36 (typically a piece of ceramic) on which a conductor film pattern having first and second portions (12 and 14, respectively), is delineated. The conductor film pattern typically comprises a conductor line of substantially uniform width which interconnects various circuit components. It can be delineated by any of a variety of commonly known pattern generation techniques (typically employing various metal deposition and photolithographic processing steps). As applied to the present invention, the conductor line comprises two segments; a first portion 12 to which the anode contact 18 of the diode 38 is attached, and a second portion 14, spaced from the first portion, and to which the diode cathode contact 24 is attached. In the present invention, the area of the first portion 12 to which the device anode is attached is of reduced width compared to the otherwise generally uniformly wide conductor film lines. Two possible geometries for this anode bonding region 47 will subsequently be described with reference to FIGS. 2 and 3.

FIG. 2 is a view of the circuit taken through sectional line 2—2 of FIG. 1. Similar reference numbers are used to designate previously described areas. The device 10 can be directly attached to the film circuit 11 by a variety of commonly used techniques (for example, thermocompression bonding). The geometry of the first portion 12 is such that the conductor film circuit line gradually necks down to a bonding region 47 of reduced width. The device anode contact 18 extends from an apex of the generally triangular cathode region 22, and is bonded to the bonding region 47 of the conductor film. The cathode contact 24 is of relatively large area (compared to the anode contact) and extends from an area of the cathode region 22 which is distal from the anode contact 18. For example, the cathode contact 24, might extend from that base of the triangular cathode region 22 which opposes the apex from which the anode contact 18 extends.

The preferred cathode/anode/film circuit illustrated in FIG. 2 yields several advantages compared to the prior art. The cathode region 22 surrounds the anode region 16 and has the effect of reducing the spreading resistance of the device. The location of the anode near an apex of the triangular cathode and attaching it to a relatively small area bond region 47 of the first portion 12, minimizes the overlap between the cathode area 22 and the first portion 12. This has the effect of reducing the parasitic capacitance between the cathode of the device and the first portion of the conductor film 12. Utilizing a relatively wide cathode area in that portion of the cathode region from which the cathode contact extends has the effect of minimizing the circuit's parasitic inductance. Using a cathode contact 24 of relatively large area increases the mechanical strength of the bond to the conductor film and facilitates heat sinking the device.

Furthermore, although FIG. 2 illustrates a single diode 38 on the substrate 26, the invention is not so limited. It can be readily observed that a plurality of devices could be generated on a single substrate and that these devices could furthermore be interconnected in series or parallel combinations by performing simple geometry modifications to either the conductor film circuit or diode contact configuration.

Referring to FIG. 3 another possible geometry of the first portion 12 is illustrated. In this embodiment a generally rectangular and relatively small area bond pad 48 projects from the otherwise uniformly wide film circuit 11, and the device anode contact 18 is bonded to this region. This geometry also presents a relatively small area of overlap between the film circuit 11 and device cathode region 22, and will therefore reduce the parasitic capacitance of the diode. It should be recognized, however, that the geometry of the film circuit and/or the device is not limited by either this embodiment or that of FIG. 1 but rather can be further modified while still remaining within the scheme of the present invention.

Referring to FIG. 4, a second embodiment of the cathode contact is illustrated. Rather than the single generally rectangular contact 24 of FIG. 1, this embodiment presents a plurality of contact posts 50 each of which being, for example, of similar geometry as the anode contact 18. This configuration is advantageous in that all device contacts can be of equal area; a quality that facilitates manufacturing by electroplating the contacts, for example. Again, the present invention is not limited to the cathode configurations represented in FIGS. 2 or 4. Any configuration which includes a directly bondable large area cathode contact or plurality of cathode contacts will provide the desirable features of low parasitic inductance, enhanced heat sinking and increased mechanical strength.

In addition to the advantages of reducing spreading resistance, parasitic capacitance and parasitic inductance, and enhancing mechanical strength and heat sinking capability, devices of the present invention are readily manufacturable using techniques commonly known in the semiconductor industry. Furthermore, these devices are particularly suitable for space applications, because in addition to their ruggedness, in the flip chip mounting configuration the device substrate provides radiation shielding of the diode.

What is claimed is:

1. A thin film circuit, comprising:
    (a) a circuit carrier which includes thereon a conductor film pattern having a first portion spaced from a second portion;
    (b) a planar semiconductor diode which overlaps and is bonded to the first and second portions of the conductor film pattern;
    (c) the semiconductor diode comprising a generally triangular cathode region surrounding an anode region, the anode region being in proximity to an apex of the triangular cathode region; and
    (d) a post-shaped anode contact extending from the anode region and bonded to the first portion of the conductor film pattern, and a post-shaped cathode contact, distal from the anode contact, extending from the cathode region and bonded to the second portion of the conductor film pattern; with that portion of the cathode region which overlaps the first portion of the conductor film pattern being of smaller area than that portion of the cathode region which overlaps the second portion of the conductor film pattern.

2. A circuit of claim 1, wherein:
    the cathode contact comprises a plurality of posts projecting from the cathode region, such that the posts can be directly bonded to the conductor film pattern.

3. A circuit of claim 1 wherein:
the cathode contact comprises a post of rectangular transverse cross sectional shape, and has a greater transverse cross sectional area than the anode contact.

4. A circuit of claim 1 wherein:
the first portion of the conductor film pattern is shaped so as to create minimal overlap with the cathode region of the semiconductor device.

5. A circuit of claim 1 comprising a plurality of semiconductor devices bonded to a single conductor film pattern such that the conductor film pattern provides a series electrical interconnection among the devices.

6. A circuit of claim 1 comprising a plurality of semiconductor devices bonded to a single conductor film pattern such that the conductor film pattern provides a parallel electrical interconnection among the devices.

7. A circuit of claim 1 comprising a plurality of semiconductor devices bonded to a single conductor film pattern such that the conductor film pattern provides series and parallel electrical interconnection among the devices.

8. A circuit of claim 1, wherein:
the cathode region is of first conductivity type; and
the anode region is of second conductivity type.

9. A circuit of claim 1, wherein:
the anode region is of the same conductivity type as the cathode region; and
the anode contact forms a Schottky barrier junction with the anode region.

* * * * *